United States Patent [19]
Dingwall

[11] Patent Number: 4,724,530
[45] Date of Patent: Feb. 9, 1988

[54] FIVE TRANSISTOR CMOS MEMORY CELL INCLUDING DIODES

[75] Inventor: Andrew G. F. Dingwall, Bridgewater, N.J.

[73] Assignee: RCA Corporation, Princeton, N.J.

[21] Appl. No.: 948,103

[22] Filed: Oct. 3, 1978

[51] Int. Cl.[4] .................. G11C 11/40; H01L 27/12
[52] U.S. Cl. .................. 365/156; 357/23.7; 357/42; 357/59
[58] Field of Search .................. 307/238, 290, 289; 340/173; 357/4, 42, 59; 365/156

[56] References Cited

U.S. PATENT DOCUMENTS

| | | | |
|---|---|---|---|
| 3,521,242 | 7/1970 | Katz | 365/156 |
| 3,990,056 | 11/1976 | Luisi et al. | 307/238 |
| 4,189,782 | 2/1980 | Dingwall | 365/156 |
| 4,196,443 | 4/1980 | Dingwall | 357/4 |

OTHER PUBLICATIONS

*RCA COS/MOS Integrated Circuits Manual*, Technical Series CMS-270, RCA/Solid State Division, Somerville, N.J. (1971), p. 22.

*Primary Examiner*—William D. Larkins
*Attorney, Agent, or Firm*—Birgit E. Morris; Kenneth R. Glick

[57] ABSTRACT

The memory cell is a five transistor cell formed with complementary symmetry metal oxide (CMOS) semiconductor insulated gate field effect transistors (IGFETs) in the silicon-on-sapphire (SOS) technology with doped polycrystalline interconnects using buried contacts. Diodes are formed where doped polycrystalline silicon lines form buried contacts to underlying silicon epitaxial regions of opposite conductivity type and where silicon epitaxial regions of opposite conductivity type contact one another. The presence of these diodes has been shown by the inventor to not be detrimental to the operation of the memory cell.

8 Claims, 3 Drawing Figures

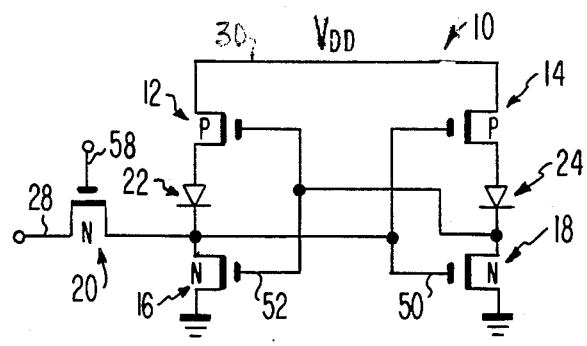
Fig. 1
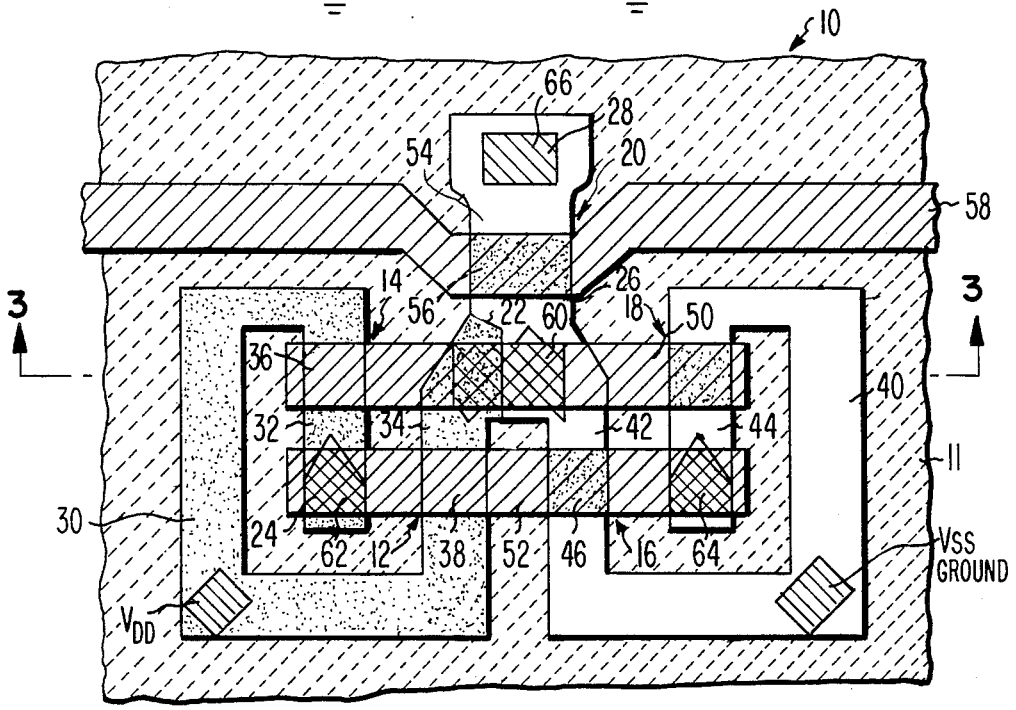
| METAL CONTACT | N+EPI | P+EPI | GATE OF P CHANNEL TRANSISTOR | GATE OF N CHANNEL TRANSISTOR | N+POLY TO N+EPI BURIED CONTACT | N+POLY TO P+EPI DIODE | SAPPHIRE SUBSTRATE |
Fig. 2
Fig. 3
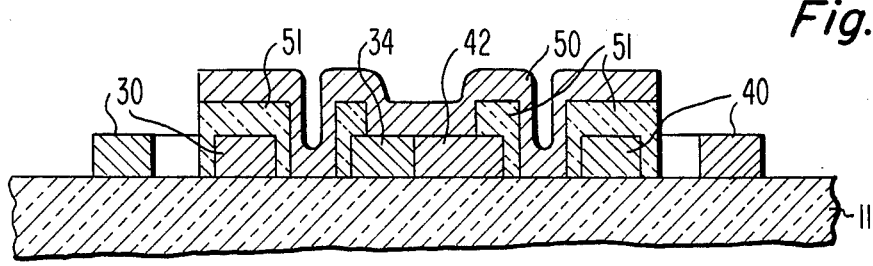

4,724,530

FIVE TRANSISTOR CMOS MEMORY CELL INCLUDING DIODES

The present invention relates to a complementary MOS structure which may be used either for making bulk CMOS or CMOS/SOS devices.

MOS integrated circuits having complementary symmetry require low power and have high noise immunity. For complex integrated circuits it is highly desirable to be able to manufacture the integrated circuits in the smallest possible chip area.

The inventor has found that by using doped polycrystalline silicon interconnects, which form polycrystalline silicon to epitaxial silicon diodes in their paths, it is possible to manufacture MOS integrated circuits which have a much greater density than the density of MOS integrated circuits which were previously known.

In the Drawing

FIG. 1 is a schematic diagram of the circuit of the preferred embodiment of a memory cell incorporating the present invention;

FIG. 2 is a modified plan view of the memory cell of FIG. 1; and

FIG. 3 is a cross-sectional view of the memory cell taken along the line 3—3 of FIG. 2.

Referring to FIG. 1, a schematic diagram of a memory cell 10 incorporating the present invention is shown. The preferred embodiment of the memory cell 10 comprises a pair of P channel insulated gate field effect transistors (IGFETs) 12, 14, three N channel field effect transistors 16, 18, 20, and a pair of diodes 22, 24. The diodes 22, 24 are constructed and utilized in a novel manner, to be explained, hereinafter, which provides advantages both in the construction and in the operation of the memory cell 10. Essentially, the memory cell 10 comprises a pair of cross coupled CMOS inverters, the first inverter comprising P-channel IGFET 12, N channel IGFET 16, and diode 22, and the second inverter comprising P-channel IGFET 14, N-channel transistor 18; and diode 24. Transistor 20 is connected between a terminal and the cathode of the diode 22 and is used as a transmission gate to input signals into the memory cell 10 and to read the output voltage of the memory cell 10 which corresponds to the output voltage of the first inverter pair. While transistor 20 of the preferred embodiment of the cell 10 is an N-channel transistor, a P-channel transistor can be substituted therefor in which event it would be connected to the anode of diode 22 rather than to its cathode.

Diodes 22 and 24, while normally not present in a standard CMOS inverter circuit, will not inhibit the operation of the cell 10, and their presence provides advantages in the cell's operation. Assuming that transistors 12 and 18 are OFF and transistors 14 and 16 are ON, the voltage measured at the cathode of diode 22 will be at ground potential and the voltage measured at the cathode of diode 24 will be approximately at $V_{DD}$. Accordingly, it will be observed that diode 24, which is in the path of the gate potential of N-channel transistor 16, is forward biased. Therefore, the gate drive to transistor 16 will be less than $V_{DD}$ by only about one diode drop, i.e. about 0.6 volts, as a result of the presence of diode 24. That slight drop will not seriously degrade the drive capacity of transistor 16. In fact, if diode 24 is leaky, the effective loss will be minimal. There is no diode in the path leading to the gate of either of the OFF transistors 12, 14. Therefore, both transistors 12, 14 will be completely shut off in the normal manner thereby preserving the typical low power characteristic of the CMOS cell 10.

The recognition by the inventor that the diodes 22, 24 in the locations shown in the memory cell 10 can be acceptable, has lead the inventor to a realization of the circuit, shown in plan view in FIG. 2, which can be manufactured using polycrystalline silicon interconnects.

With reference to FIGS. 2 and 3, a modified plan view and a cross-sectional view of the memory cell 10 manufactured using silicon-on-sapphire (SOS) technology, are shown. The cell 10 comprises a sapphire substrate 11 having a silicon epitaxial layer formed into transistors 12, 14, 16, 18, 20 thereon. P+ epitaxial regions ("epi") in FIG. 2 are shown using heavy dapple marks, whereas N+ epi regions are shown with no dapple marks. In particular, the positive power supply voltage, $V_{DD}$, is shown connected to a P+ doped semiconductor common region 30 comprising the sources of the transistors 12, 14 via a metal contact to the P+ epi. The P+ drain 32 of transistor 14 and the P+ drain 34 of transistor 12 are separated from their respective sources by N− channel regions 36, 38, respectively. Similarly, N− channel transistors 16, 18 are shown with an N+ doped semiconductor common region 40 comprising their sources, separated from their N+ drains 42, 44, respectively, by P− channel regions 46, 48, respectively. The negative power supply, $V_{SS}$, is connected to the sources 40 via a metal contact. Diode 22 is formed with P+ epitaxial region 34 as its anode and with N+ epitaxial region 42 and an N+ polycrystalline silicon line 50 as its cathode. Similarly, diode 24 has P+ epitaxial region 32 as its anode and an N+ polycrystalline silicon line 52 as its cathode.

The memory cell 10 further comprises N channel transmission gate IGFET 20 which is used to set and to determine the state of the memory cell 10. In the preferred embodiment of the invention, the IGFET 20 is comprised of two N+ epitaxial regions 26, 54, which are each referred to herein as a "drain-source". The reason for the designation "drain-source" relates to the fact that the transmission gate 20 is operated in two modes. In one mode the region 26 is the drain and the region 54 is the source, while in the other mode the region 54 is the drain and the region 26 is the source. A P− channel region 56 lies between the two drain-sources 26 and 54. An N+ doped polycrystalline silicon line 58 overlies a channel insulator (not shown) which in turn overlies the channel region 56. The polycrystalline silicon line 58 acts as the gate of the transistor 20. A contact opening 66 is formed in the drain-source 54 which is on the side of the channel region 56 away from the two inverters. An input-output connection 28 from the transistor 20 is formed at the contact 66 as shown in FIG. 2.

The N+ polycrystalline silicon line 50 acts as the gate of transistors 14 and 18 and makes an ohmic contact to the drain of N channel transistor 16 and a rectifying contact to the drain of P channel transistor 12. Similarly, the N+ polycrystalline silicon line 52 simultaneously acts as the gate of transistors 12 and 16 and makes an ohmic contact to the drain of N channel transistor 18 and a rectifying contact to the drain of P channel transistor 14. The various contacts 60, 62, 64 are so-called buried contacts, i.e. contacts in which the polycrystalline silicon lines 50, 52 make direct contact to the underlying silicon epitaxial layer.

In order to manufacture the memory cell 10, one starts with an insulating substrate 11, such as a sapphire substrate, upon which an epitaxial semiconductor layer can be grown. While sapphire is used in the preferred embodiment of the invention, the insulating substrate may be comprised of sapphire, spinel, or beryllium oxide. A semiconductor, such as silicon, is epitaxially grown thereon using conventional methods known in the SOS art. Following the growth of the semiconductor epitaxial layer, an oxide layer is formed on the surface of the semiconductor layer by any well known method, such as by thermal oxidation, in the case of silicon. A photoresist layer is applied over the surface of the oxide layer, and the photoresist layer is defined using standard photolithographic techniques. The photoresist layer is then developed to form a mask which covers areas of the silicon epitaxial layer which are to become part of the transistors 12, 14, 16, 18, 20. The exposed portions of the oxide and silicon epitaxial layers are removed by etching.

Following the removal of the undesired portions of the silicon epitaxial layer, the balance of the photoresist and oxide layers are removed. Then the substrate is subjected to an ion implantation of a donor ion, such as phosphorus, in order to make the epitaxial layer N− in conductivity for the purpose of adjusting the threshold voltages of the P channel IGFETs, i.e. to form the channel regions of the P channel IGFETs 12, 14. The substrate is then covered with a layer of photoresist which is defined and developed using a photomask to expose the channel regions of the N channel IGFETs 16, 18, 20. The photoresist covered substrate is subjected to an ion implantation of an acceptor ion, such as boron, in order to adjust the threshold voltages of the N channel transistors. The remaining photoresist is then stripped and the substrate is placed into a furnace heated to about 1000° C. into which a small quantity of steam and HCl are flowing in order to grow an oxide layer over the remaining portions of the epitaxial layer.

The substrate is next covered with a layer of photoresist which is defined using a photomask and developed to expose areas where buried contacts are to be formed. The shape of the buried contacts 60, 62, 64 is chosen to insure proper contact between the doped polycrystalline silicon and the underlying epitaxial regions. The oxide 51 exposed through the developed photoresist is removed by etching in a solution, such as buffered hydrofluoric acid. The remaining photoresist is removed and a layer of polycrystalline silicon is deposited over the substrate by any suitable process, such as by the pyrolytic decomposition of silane.

The polycrystalline silicon layer is doped to N+ conductivity by placing the substrate into a diffusion furnace and subjecting it to a phosphorus oxychloride (POCl$_3$) diffusion, at 1050° C. for about 10 minutes to achieve a donor concentration of about $10^{20}$ donor atoms/cm$^2$.

A layer of photoresist is applied over the surface of the doped polycrystalline silicon layer and a photomask is used to define the polycrystalline silicon interconnects, which include the buried contacts and the gates of IGFETs. The defined photoresist is developed and the exposed portions of the doped polycrystalline silicon layer are removed by etching in a solution of potassium hydroxide (KOH), ethanol, and water. The photoresist layer is stripped and a new layer of photoresist is applied. The new photoresist layer is defined using a photomask so that regions which are to have a P+ conductivity are exposed for the purpose of ion implantation. The substrate is subjected to an ion implantation of an acceptor impurity, such as boron, and a dose of about $10^{15}$ atoms of boron/cm$^2$ is implanted into the exposed epitaxial and polycrystalline silicon layers. Next, the layer of photoresist is stripped and a new layer of photoresist is applied over the surface of the substrate. Then, the new layer of photoresist is defined to expose the regions which are to be doped to an N+ conductivity. The substrate is placed in an ion implanter and the exposed portions of the epitaxial layers and polycrystalline silicon layers are subjected to an ion implantation of a donor impurity, such as phosphorus, which is implanted to a dosage of about $2 \times 10^{15}$ atoms/cm$^2$.

Next, the remaining portions of the photoresist layer are stripped and the epitaxial layer is placed into a furnace heated to about 900° C. into which a small quantity of steam and HCl are flowing in order to grow an oxide to a thickness of 1000 Å. The substrate is then removed from the furnace and a thick silicon dioxide layer (not shown) is deposited over the thermally grown silicon dioxide layer by any suitable process such as the thermal decomposition of silane in order to form a composite layer having a thickness of 6000 Å.

Next, metal contact openings are formed in the thick oxide layer. That is accomplished by standard photolithographic techniques which include the deposition of a photoresist layer and its definition by a photomask, and subsequent etch in a buffered hydrofluoric acid as heretofore described.

Following the formation of metal contact openings, a layer of metal, such as aluminum (not shown) is deposited over the surface of the oxide layer. Next, using standard photolithographic techniques, the metal layer is defined. Finally, a protective oxide (not shown) is applied over the surface of the metal interconnects by any suitable process, such as the thermal decomposition of silane to form an oxide having a thickness of about 10,000 Å over the metal interconnects.

Finally, bond pad openings are formed in the protective oxide by a photolithographic step of the type heretofore described using buffered hydrofluoric acid to remove the protective oxide from over the bond pads, thereby completing the formation of the cell.

As a result of the use of the present invention, extremely dense memory cells can be manufactured, which memory cells make use of buried contacts and conductive polycrystalline silicon interconnects. The diodes which are formed within the polycrystalline silicon interconnects have been found to be not detrimental to the operation of the memory cell.

As will be understood by one of ordinary skill in the art, the N− channel transmission gate IGFET 20 can be replaced by a P− channel transmission gate IGFET if the doped polycrystalline silicon is made to have a P+ type conductivity and the connections between the gates of one inverter and the outputs of the other inverter are at the anodes of the diodes rather than at their cathodes as shown in FIG. 1. Also, the connection to the drain-source of the transmission gate IGFET would be at the anode of the diode in the first inverter.

By incorporating the diodes formed between the doped polycrystalline silicon and the epitaxial silicon in the memory cell 10, the size of the cell can be made very small, whereas elimination of the diodes would require a cell of considerably larger area.

What is claimed is:

1. An integrated circuit structure comprising:
   (a) a substrate formed of an insulating material upon which a semiconductor can be epitaxially grown;
   (b) a layer of semiconductor material epitaxially grown on said insulating layer, said semiconductor layer being formed into a memory cell comprising a first inverter and a second inverter, each of said inverters comprising a P channel IGFET, each of said P channel IGFETs having a P+ doped semiconductor common region formed in said epitaxial layer, said P+ doped semiconductor common region further comprising means connecting said common region to a positive power supply, each of said inverters also comprising an N channel IGFET, each of said N channel IGFETs having an N+ doped semiconductor common region formed in said epitaxial layer, said N+ doped semiconductor common region further comprising means connecting said N+ doped semiconductor common region to the lowest potential of the power supply, a pair of doped polycrystalline silicon lines of one conductivity type, each of said doped polycrystalline silicon lines overlying an insulating layer over the channel region of the IGFETs in one of said inverters and simultaneously acting as the gate of the N channel transistor and the P channel transistor in one of said inverters and as an ohmic contact to the drain of one of the transistors in the other inverter and a rectifying contact to the drain of the other transistor in the other inverter, a transmission gate IGFET formed within said silicon epitaxial layer, said transmission gate IGFET having two drain-source regions of the same conductivity type as said polycrystalline silicon lines and having an opposite conductivity type channel region therebetween, the gate of said transmission gate IGFET overlying an insulating layer on said channel region and being comprised of a third doped polycrystalline silicon line of the same conductivity as said other polycrystalline silicon lines, one of said drain-source regions of said transmission gate IGFET being connected to one of said pair of doped polycrystalline silicon lines at the ohmic contact to the drain of said transistor in said first inverter which has the same conductivity type as said third polycrystalline line.

2. The integrated circuit of claim 1 wherein said substrate is selected from the group consisting of sapphire, spinel, and beryllium oxide.

3. The integrated circuit of structure of claim 2 wherein said semiconductor material consists of silicon.

4. The integrated circuit structure of claim 3 wherein the drain-source regions of said transmission gate IGFET of N+ type conductivity and all of said polycrystalline silicon lines are of N+ type conductivity.

5. The integrated circuit structure of claim 3 wherein the drain-source regions of said transmission gate IGFET of P+ conductivity and all of said polycrystalline silicon lines are of P+ type conductivity.

6. A five transistor memory cell comprising:
   (a) a first inverter and a second inverter, each of said inverters comprsing a P channel IGFET having its source connected to positive powee supply means and its drain connected to the anode of a diode, each of said diodes being formed by the junction of a polycrystalline silicon line of cone conductivity type with a single crystal silicon layer of opposite conductivitity type with a single crystal silicon layer of opposite conductivity type, the cathode of each sid diode being connected to the drain of an N channel IGFET, the source of each said N channel IGFET being connected to the low potential of power supply means, and the gates of each said P channel IGFET in each inventer and each said N channel IGFET of the same inverter being connected together to form an input terminal for said inverter;
   (b) a transmission gate IGFET having one terminal, other than its gate, connected to the input terminal of said second inverter and to the drain of the transistor in said first inverter which corresponds in conductivity type to the terminal of said transmission gate IGFET to which it is conencted, said terminal of said first inverter to be called its output terminal, and being a corresponding output terminal for second inverter; and
   (c) means connecting the input terminal of said first inverter to the output terminal of said second inverter.

7. The memory cell of claim 6 wherein said transmission gate IGFET is a P channel IGFET and the output terminal of each of said inverters corresponds to the junction of the drain of the P channel transistor and the anode of the diode within each of said inverters.

8. The memory cell of claim 6 wherein said transmission gate IGFET is an N channel IGFET and the output terminal of each of said inverters corresponds to the junction of the drain of the N channel transistor and the cathode of the diode within each of said inverters.

* * * * *